United States Patent [19]

Kuboki et al.

[11] Patent Number: 4,527,148
[45] Date of Patent: Jul. 2, 1985

[54] ANALOG-DIGITAL CONVERTER

[75] Inventors: Shigeo Kuboki, Nakaminato; Kazuo Kato, Ibaraki; Nobuaki Miyakawa, Hitachi, all of Japan

[73] Assignee: Hitachi, Ltd., Tokyo, Japan

[21] Appl. No.: 437,303

[22] Filed: Oct. 28, 1982

Related U.S. Application Data

[63] Continuation of Ser. No. 115,146, Jan. 24, 1980, abandoned.

[30] Foreign Application Priority Data

Jan. 26, 1979 [JP] Japan .................................. 54-7910

[51] Int. Cl.³ ...................... H03K 13/02; H03K 13/03
[52] U.S. Cl. ........................ 340/347 AD; 340/347 M; 367/65; 367/66; 367/67
[58] Field of Search ................... 340/347 AD, 347 M; 375/39; 367/65-67; 343/5 DP

[56] References Cited

U.S. PATENT DOCUMENTS

| | | | |
|---|---|---|---|
| 3,646,448 | 2/1972 | Harmon et al. .................. | 375/39 X |
| 3,685,047 | 8/1972 | Sherer et al. ................. | 340/347 AD |
| 3,699,325 | 10/1972 | Montgomery, Jr. et al. ...... | 340/347 AD X |
| 3,798,637 | 3/1974 | Fruhauf ....................... | 340/347 AD |
| 4,016,557 | 4/1977 | Zitelli et al. ................. | 340/347 AD |
| 4,121,055 | 10/1978 | Doherty ........................ | 370/113 X |
| 4,366,469 | 12/1982 | Michaels et al. . | |

OTHER PUBLICATIONS

Bernstein, What to Look for in Analog Input/Output Boards, Electronics, Jan. 19, 1978, pp. 113-119.

Primary Examiner—T. J. Sloyan
Attorney, Agent, or Firm—Antonelli, Terry & Wands

[57] ABSTRACT

An A/D converter used with an A/D conversion system in which each of input analog signals applied thereto is amplified at a gain selected depending or the level of said each signal and subjected to A/D conversion. The A/D converter is arranged to select a desired one of predetermined gain select modes concerned with the selection of gain of the amplifier. Further, the A/D converter produces a reference analog signal of a level corresponding to the selected gain select mode and compares the input analog signal with the reference analog signal, thereby determining whether or not the gain of the amplifier is to be changed.

7 Claims, 17 Drawing Figures

ANALOG-DIGITAL CONVERTER

This is a continuation of application Ser. No. 115,146 filed Jan. 24, 1980 now abandoned.

BACKGROUND OF THE INVENTION

1. Field of the Invention

The present invention relates to an analog-digital (A/D) converter and more particularly to an A/D converter used for an A/D conversion system which receives various analog input signals of different levels and applies these input analog signals to A/D conversion after amplifying them at gains determined depending on the respective levels of the input signals.

2. Description of the Prior Art

In known A/D conversion systems connected through an interface with a data processor and used for converting analog input signals of various different levels into digital signals suitable for processing in the data processor, the input signals are converted into digital signals after amplifying them by an amplifier with a gain which is variable in accordance with the respective ranges of the input signal levels in order to extend the dynamic range of the system for various input signals.

A well-known A/D converter used for such a purpose comprises a variable gain amplifier whose gain is selectively set at either one of $2^0, 2^1, 2^2, \ldots, 2^N$ (N: a positive integer) and a microprocessor for determining the optimum gain corresponding to the level range of each of the input signals, wherein the gain of the amplifier is controlled through a control circuit in accordance with the optimum gain determined by the microprocessor, thus providing an automatic gain control function. Such an A/D converter is disclosed, for example, in the article entitled "What to look for in analog input/output boards" presented by Norman Bernstein in Electronics issued Jan. 19, 1978 or pages 113 to 119. The A/D converter having the automatic gain control function has advantages in that various input signals of different level ranges are subjected to A/D conversion with substantially the same accuracy. In spite of this advantage, since the A/D conversion process for each input signal comprises the steps of subjecting the input signal to A/D conversion by setting the gain of the amplifier at "1" in order to determine the level range of the input signal, determining the optimum gain of the amplifier by the microprocessor in accordance with the level range determined from the digital signal thus obtained, controlling the gain of the amplifier by the control circuit to set it at the optimum gain determined by the microprocessor, and again subjecting the input signal to A/D conversion, it has disadvantages in that it requires a considerably longer time for A/D conversion of each input signal, thus reducing the efficiency of the system.

The recent development of the large scale integrated circuit technique has made it possible to incorporate the A/D converter section and the control circuit in a hybrid IC or a one-chip LSI. Further, the analog input/output system is available on the market as a standardized plug-in unit. In the A/D converter having an automatic gain control as mentioned above, however, the control circuit is quite complicated and therefore, even though the A/D converter section is made up of one chip LSI, the control circuit must be provided in a separate unit. Further, a bus interface must be provided between the microprocessor and the control circuit when arranged on a board, and therefore it leads to the requirements of making complicated interconnections and occupying a large area on the board in the assembly of the A/D converter.

For these reasons, there exists a great demand for an A/D converter wherein the time required for A/D conversion is shortened and the control circuit for gain selection is simplified by simplification of the process for determining the level range of the analog signal, thereby making it possible to incorporate the A/D converter section with the control circuit in a one chip LSI. Further, it is desired that the converter be broadly applicable to various modes of gain selection determined depending on the characteristics of the processes to which the A/D converter is combined by standardizing the essential parts thereof, while making it easy to selectively exchange the remaining parts which are difficult to standarize in accordance with the desired gain select mode.

SUMMARY OF THE INVENTION

Accordingly, the primary object of the present invention is to provide an A/D converter adapted to be incorporated into an A/D conversion system of the type which receives and converts various analog input signals into digital signals after amplifying them by an amplifier whose gain is selected according to the level ranges of the input signals and wherein the time required for A/D conversion is shortened and the control circuit for selecting the gain is simplified and standardized as far as possible by simplification of the process of determining the level range of the input signals, so that the A/D converter section and the control circuit are comprised of a circuit configuration suitable for being arranged into a one chip LSI, and that the mode in gain select of the amplifier is easily and selectively changed in accordance with the characteristics of process or input signal to which the A/D converter is applied.

Another object of the invention is to provide an A/D converter whose gain select mode is determined upon addressing the channel for an input signal by a microprocessor thereby extending the dynamic range in A/D conversion of input signals by the converter and also in which the level range of each input signal is determined in an early stage of the successive approximation cycle for A/D conversion of each input signal, thereby reducing the duty cycle of a microprocessor required for the determination of the input level range.

According to the present invention, an A/D converter is arranged to select one of predetermined gain select modes of an amplifier for amplifying input analog signals, to compare the level of each input analog signal with a predetermined reference analog signal level corresponding to the selected gain select mode, and to determine whether or not the gain is to be changed in accordance with the result of the comparison.

DESCRIPTION OF THE PREFERRED EMBODIMENTS

Figure 1:
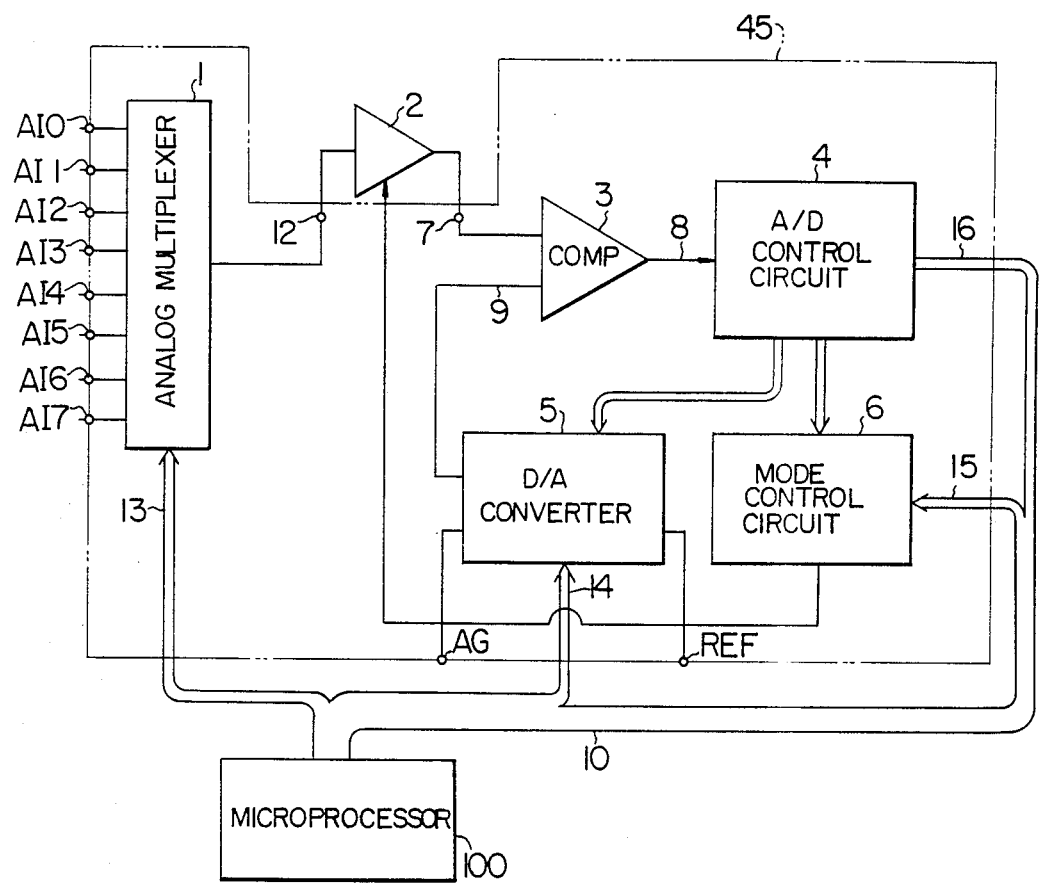
FIG. 1 is a circuit diagram showing a basic configuration of an A/D converter according to the present invention.

The diagram of FIG. 1 shows a basic diagram of an A/D conversion system using an A/D converter according to the present invention. In FIG. 1, reference numeral 1 shows an analog multiplexer which receives a plurality of analog input signals at its input terminals AI0, AI1, AI2, . . . , AI7 and outputs them, one by one, from its output 12 in response to the address control signals 13 applied thereto from an external microprocessor 100. Numeral 2 shows a variable gain amplifier whose gain is variable in accordance with the control signal applied from a mode control circuit 6 described later. The output of the multiplexer 1 is amplified by the amplifier 2 and applied to one of the input terminals of the comparator 3. Numeral 4 shows an A/D control circuit including a successive approximation register for storing digital data obtained by subjecting the analog output signal of the amplifier 2 to A/D conversion by the method mentioned later in detail. Numeral 5 shows a D/A converter for generating a reference level analog signal 9 to be applied to the other input terminal of the comparator 3, and comprising, for instance, a ladder resistor and a tree switch. In this system, the block 45 defined by one-dot chain lines represents the A/D converter according to the present invention.

Figure 2:
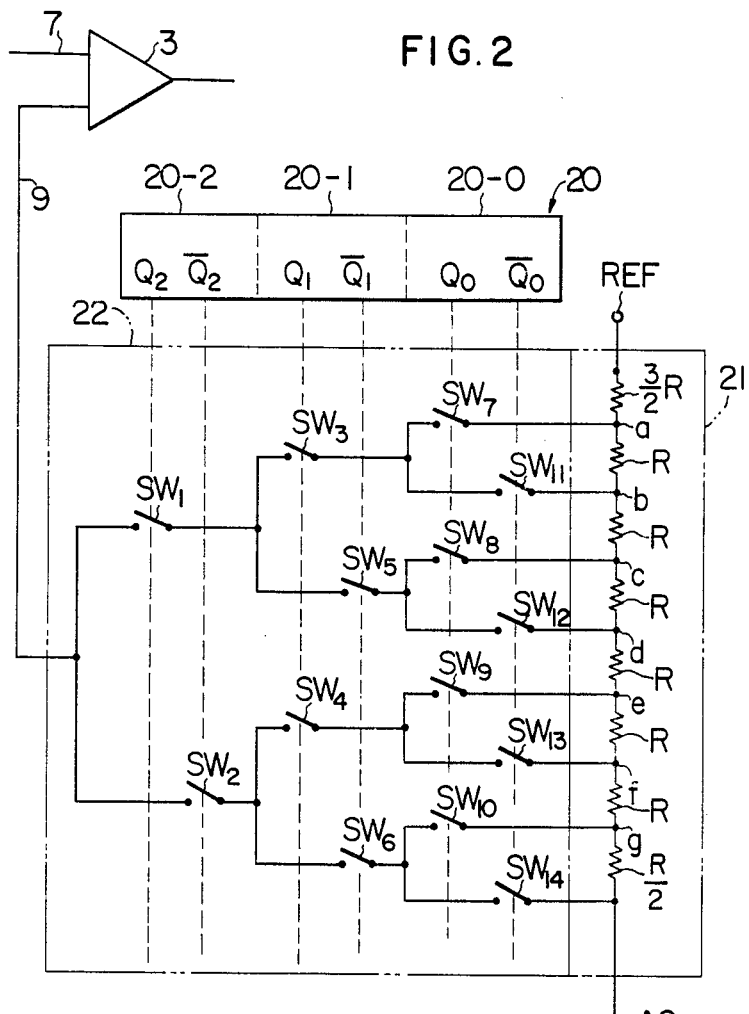
FIG. 2 is a circuit diagram showing a D/A converter used in the A/D converter of FIG. 1.

Next, the operation of the comparator 3, the A/D control circuit 4 and the D/A converter 5 will be explained with reference to FIG. 2. By way of explanation, FIG. 2 shows only essential parts in an A/D conversion system for converting an analog signal into a 3-bit binary digital signal. Numeral 20 shows a successive approximation register in which 20-0, 20-1 and 20-2 correspond to the digit positions of $2^0$, $2^1$ and $2^2$ respectively. When the most significant bit (MSB) of the 3-bit digital signal, i.e. the "$2^2$"-bit, is "1", a "1" signal is produced at $Q_2$ and a "0" signal is produced at $\overline{Q}_2$. When MSB is "0", by contrast, a "0" signal is produced at $Q_2$ and a "1" signal is produced at $\overline{Q}_2$. Numeral 21 shows a ladder resistor including six resistors R in series and additional resistors 3/2R and ½R at the ends, respectively. A reference voltage is applied across the terminals REF and AG. Numeral 22 shows a tree switch including switch units $SW_1$, $SW_2$, . . . $SW_{14}$ and connected with the ladder resistor as shown. These switch units are actuated in response to the outputs $Q_2$, $\overline{Q}_2$, . . . , $Q_0$, $\overline{Q}_0$ of the successive approximation register 20. When $Q_2 = 1$ and $\overline{Q}_2 = 0$, for instance, the switch $SW_1$ is closed and the switch $SW_2$ is open.

The A/D control circuit 4 includes a device for generating a timing signal, by which the timings of the operations mentioned below are controlled. When the analog output signal 7 of the amplifier 2 is applied to the comparator 3, the MSB, i.e., the digit position of 20-2 of the successive approximation register 20 is set at "1" and the digit positions of 20-1 and 20-0 are set at "0". As a result, the circuit including $SW_1$, $SW_5$ and $SW_{12}$ is established, so that the potential at the junction point d of the ladder resistor is applied as a reference signal 9 to the comparator 3 and compared with the analog signal 7. If signal 7 > signal 9, the digit position of 20-1 remains at "1", while if signal 7 ≦ signal 9, it is changed to "0". Next, if the digit position of 20-1 is set at "1", while the digit position of 20-0 remaining at "0", the corresponding switches are closed. In the case where the digit position of 20-2 has been set at "1" with the signal 7 being larger than signal 9, for instance, the contents of the successive approximation register is "110". Therefore, the circuit including $SW_1$, $SW_3$ and $SW_{11}$ is established, so that the potential at the junction point b of the ladder resistor is applied as a new reference signal 9 to the comparator 3 and compared with the signal 7. If the signal 7 is larger than the new reference signal 9, the digit position of 20-7 remains at "1", while if the signal 7 is not larger than the new reference signal 9, it is changed to "0". A similar operation is repeated for the digit position of 20-0. Upon completion of the above-mentioned operation for all the digit positions, the data stored in the successive approximation register represents a digital signal obtained by A/D conversion of the analog signal.

Figure 3:
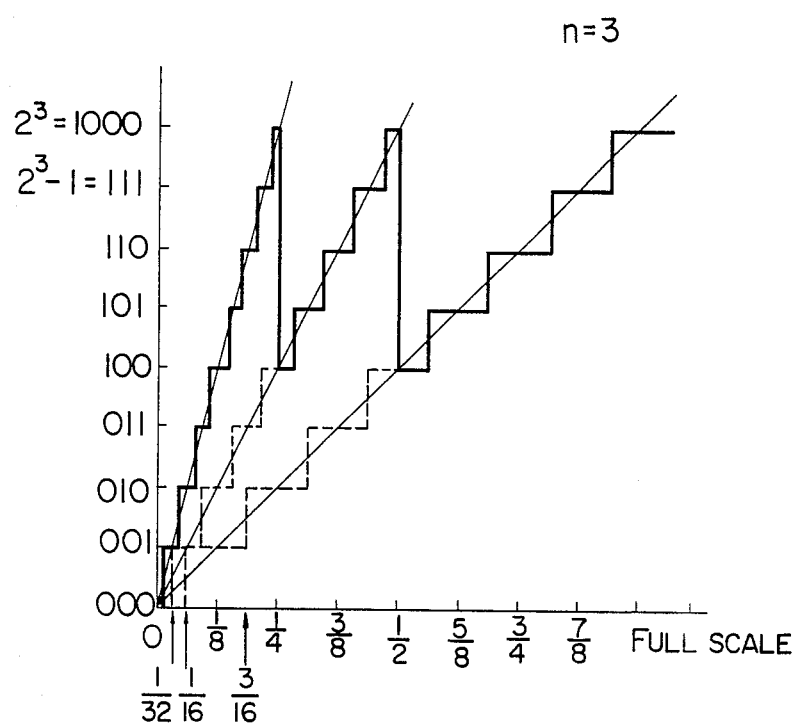
FIG. 3 is a diagram showing the relation between analog input signals and digital values obtained by A/D conversion.

As easily understood from the above-mentioned construction, this A/D conversion system is such that a digital value is determined by comparing an analog signal with various reference voltages divided by the latter resistor. The basic reference voltage applied across the terminals REF and AG of the ladder resistor is selected to be substantially equal to the possible maximum one of various different levels of the intended analog signals applied to the multiplexer 1. In the A/D conversion system for converting an analog signal to a three-bit digital signal, for instance, the minimum unit "001" corresponds to almost ⅛ (12.5%) of the basic reference voltage. As for the analog signal of a half level of the maximum level, therefore, the accuracy thereof is ⅛/½=¼ (25%), i.e. a half of the accuracy for the signal of the maximum level. In the case of A/D conversion of an analog signal having a level half or lower than the maximum level, the same accuracy as that of an analog signal having a level exceeding ½ of the maximum level is obtained if subjected to A/D conversion after being amplified by 2 times. This relation is shown in FIG. 3. In FIG. 3, the abscissa represents the level of the analog signal, and the ordinate the converted digital value in 3-bit A/D conversion. If an analog signal of a level not higher than ½ of maximum level or full scale but higher than ¼ of maximum level is subjected to A/D conversion after being amplifier by 2 times and an analog signal of a level not higher than ¼ of maximum level is subjected to A/D conversion after being amplified by 4 times, the relationship between the analog input signal level and the value of the converted digital signal will be as shown by a thick solid line in the figure. For example, analog signals of (¾±1/16) and (¾±1/32) of the full scale are both converted into "110". If the latter signal is subjected to A/D conversion without being amplified, "011" will be obtained. This corresponds to (¾±1/16) of the full scale, which means that the possible maximum quantum error is doubled.

It is possible to advantageously extend the dynamic range of the system, by amplifying the input analog signal at a gain selected in accordance with the input analog signal level before subjecting it to A/D conversion. In order to realize this, however, it is required to first effect an A/D conversion cycle for determining the input analog signal level, then determining which mode should be applied of the double gain select mode where the gain of the amplifier is selectively doubled or the quadruple gain select mode where the gain is selectively quadrupled, setting the amplifier at a gain corresponding to the mode thus determined in accordance with the input signal level, and again effecting the A/D conversion cycle on the input signal after amplifying it at the selected gain. Further, in order to extend the dynamic range of A/D conversion in the system, it is desirable to preliminarily prepare many different gain select modes and select the optimum one in accordance with the input signal level. However, this complicates the construction of the gain-select control circuit and requires a considerably long operation time for A/D conversion being effected merely for determining the input signal level. According to this invention, these problems are solved as discussed below.

(1) In order to extend the versatility of the system, it is desirable to provide an A/D converter with the capability of processing various analog input signals of different level ranges. However, since the level ranges of analog input signals supplied to the system when applied to a specific process are generally limited, it is very seldom that all of the level ranges provided to an A/D converter are utilized effectively in application to a specific process. According to the present invention, therefore, a mode control circuit, is provided for presetting a gain select depending on anticipated level ranges of analog input signals. The setting of the gain select mode is preferably programmed by a command from an external microprocessor.

(2) The A/D converter is provided with terminals for separably connecting thereto a variable gain amplifier selected depending on the intended gain select mode, so that it is possible to exchange the amplifier when the system is to be used in a different gain select mode. The gain of the variable gain amplifier is programmable according to the determination of the input signal level range.

(3) It is possible to determine the level range of an analog input signal by comparison with a reference level range corresponding to the programmed gain select mode. Therefore, the determination of the level range is simplified. If a double gain select mode is set, for instance, it is sufficient to determine whether the analog input signal level is higher than or not higher than ½ of the full scale and therefore the determination is possible from the MSB value alone of the digital value subjected to A/D conversion. If a quadruple gain mode is set, on the other hand, all that is needed is to determine whether the input signal level is not higher or higher than ¼ of the full scale, and therefore discrimination is possible from the value of two most significant bits of the digital value subjected to A/D conversion.

Figure 4:
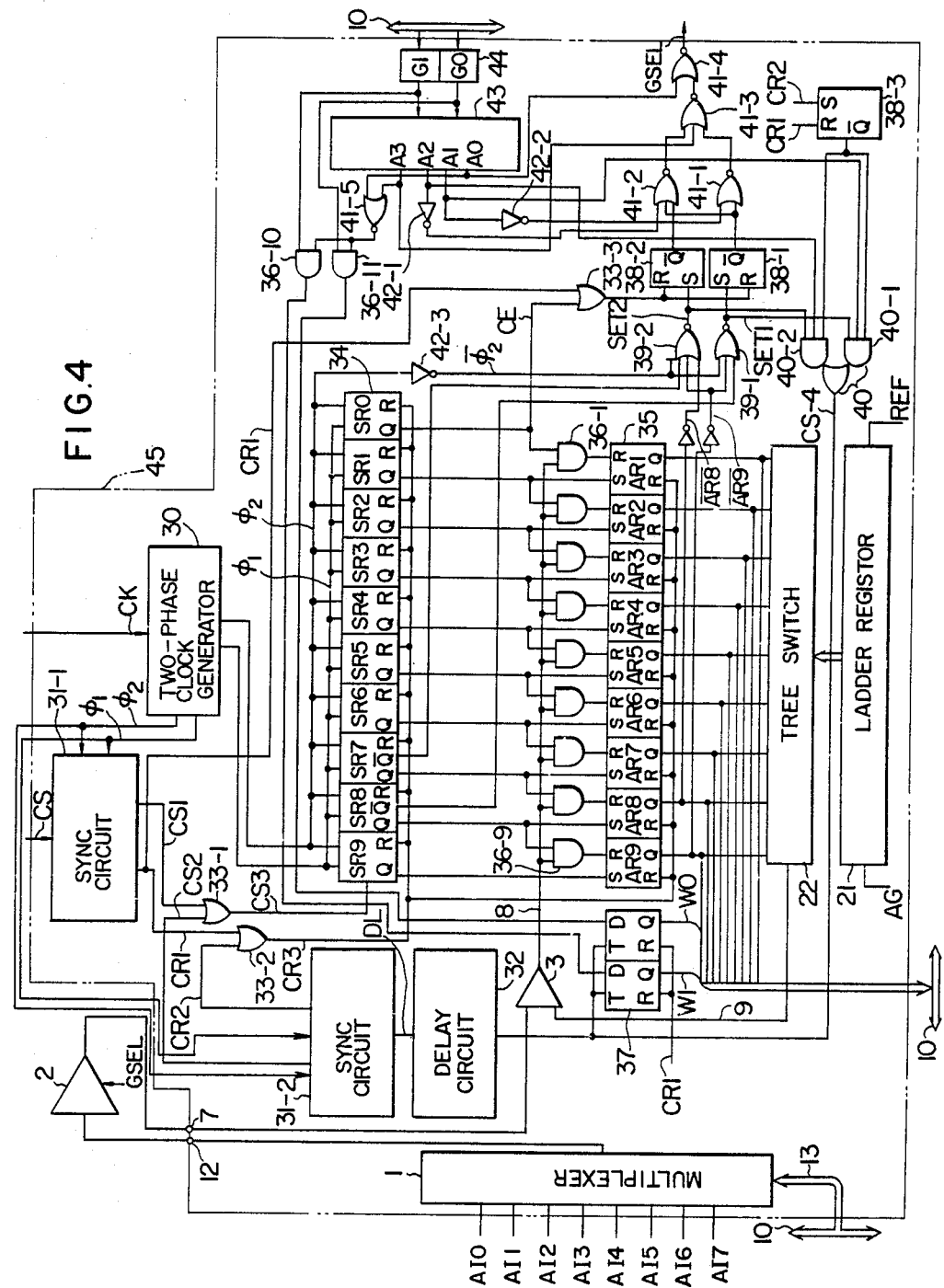
FIG. 4 is a circuit diagram showing an embodiment of the A/D converter according to the present invention.

Next, an embodiment of the present invention applied to a 9-bit A/D converter will be explained with reference to FIG. 4. In FIG. 4, the parts similar to those in FIG. 1 are denoted by similar reference numerals. The A/D control circuit corresponding to the block 4 in FIG. 4 comprises a two-phase clock generator circuit 30, synchronizing circuits 31-1, 31-2, a delay circuit 32, OR gates 33-1, 33-2, a 10-bit shift register 34, AND gates 36-1, 36-2, . . . , 36-9, a 9-bit successive approximation register 35 and a 2-bit register 37 for storing weighting bits. The mode control circuit corresponding to the block 6 in FIG. 1 comprises a 2-bit register 44 for setting the gain select mode, an address decoder 43, NOR gates 39-1, 39-2, 41-1, 41-2, . . . , 41-5, a 2-AND NOR gate 40, RS flip-flops 38-1, 38-2, 38-3, AND gates 36-10, 36-11, an OR gate 33-3, and inverters 42-1, 42-2, 42-3.

Figure 5A:
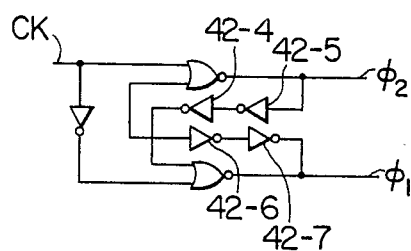
FIGS. 5a and 5b and FIG. 6 are diagrams showing configurations of two-phase clock generator circuit, shift register and synchronizing circuit used in the A/D converter of FIG. 4, respectively.
Figure 5B:
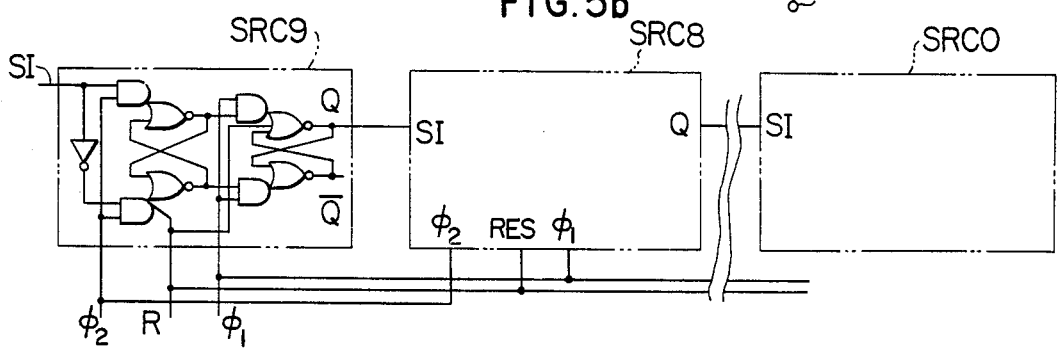
Figure 6:
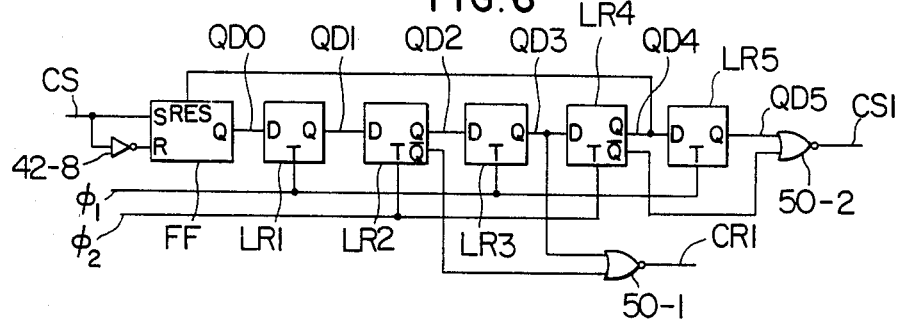
Figure 7:
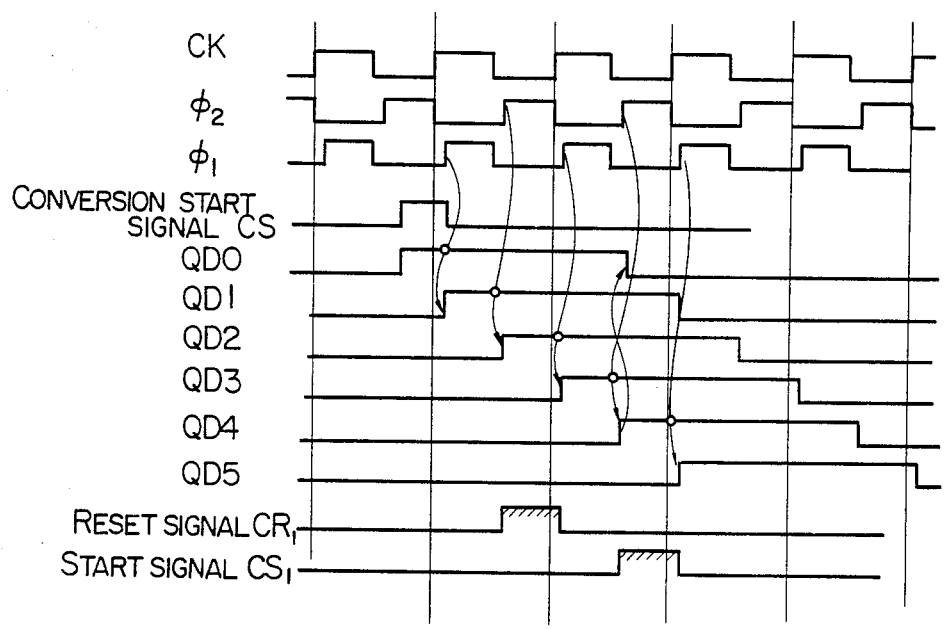
FIG. 7 is a time chart showing the timings in operation of the circuit of FIG. 6.

The two-phase clock generator circuit 30 receives a reference clock pulse signal CK and generates two-phase clock pulse signals $\phi_1$ and $\phi_2$ at different phases, as shown in FIG. 7. The two-phase clock generator circuit 30 may be comprised of a circuit as shown in FIG. 5a, and the phase interval between the two-phase clock pulses $\phi_1$ and $\phi_2$ is determined by a transmission delay time due to the inverters 42-4, 42-5, 42-6 and 42-7. The shift register 34 may be comprised of ten master-slave type flip-flops SRC0, SRC1, SRC2, . . . , and SRC9 each including a master flip-flop and a slave flip-flop as shown in FIG. 5b. Each of the flip-flops SRC is driven by the signals $\phi_1$ and $\phi_2$ in response to the signal SI as a carry input. Also, the signal R resets the associated master flip-flop and slave flip-flop. As shown in FIG. 6, the synchronizing circuits 31-1 and 31-2 may comprise an SR flip-flop FF, D-type latch circuits LR1 to LR5, NOR gates 50-1 and 50-2, and an inverter 42-8. As shown in FIG. 7, the synchronizing circuit 31-1 is impressed with a conversion start signal CS, generally asynchronous with the clock pulse CK, and produces a reset signal CR1 and a start signal CS1 synchronous with the two-phase clock pulses $\phi_1$ and $\phi_2$. In other words, the D-type latch circuits LR1 to LR5 are each arranged to latch the input signal applied to the input terminal D in response to the leading edge of the pulse $\phi_1$ or $\phi_2$ applied to its terminal T and produce the same at the terminal Q. Therefore, the input or Q-output signals $QD_0$, $QD_1$, . . . , $QD_5$ of the latch circuits take waveforms as shown in FIG. 7. As a result, a reset signal CR1 is produced from the NOR gate 50-1 under the NOR condition of the $\overline{Q}$ output of the latch circuit LR2 and the Q output of LR3, while a start signal CS1 is produced from the NOR gate 50-2 under the NOR condition of the $\overline{Q}$ output of LR4 and the Q output of LR5, synchronously with the signals $\phi_2$ and $\phi_1$, respectively.

Figure 8:
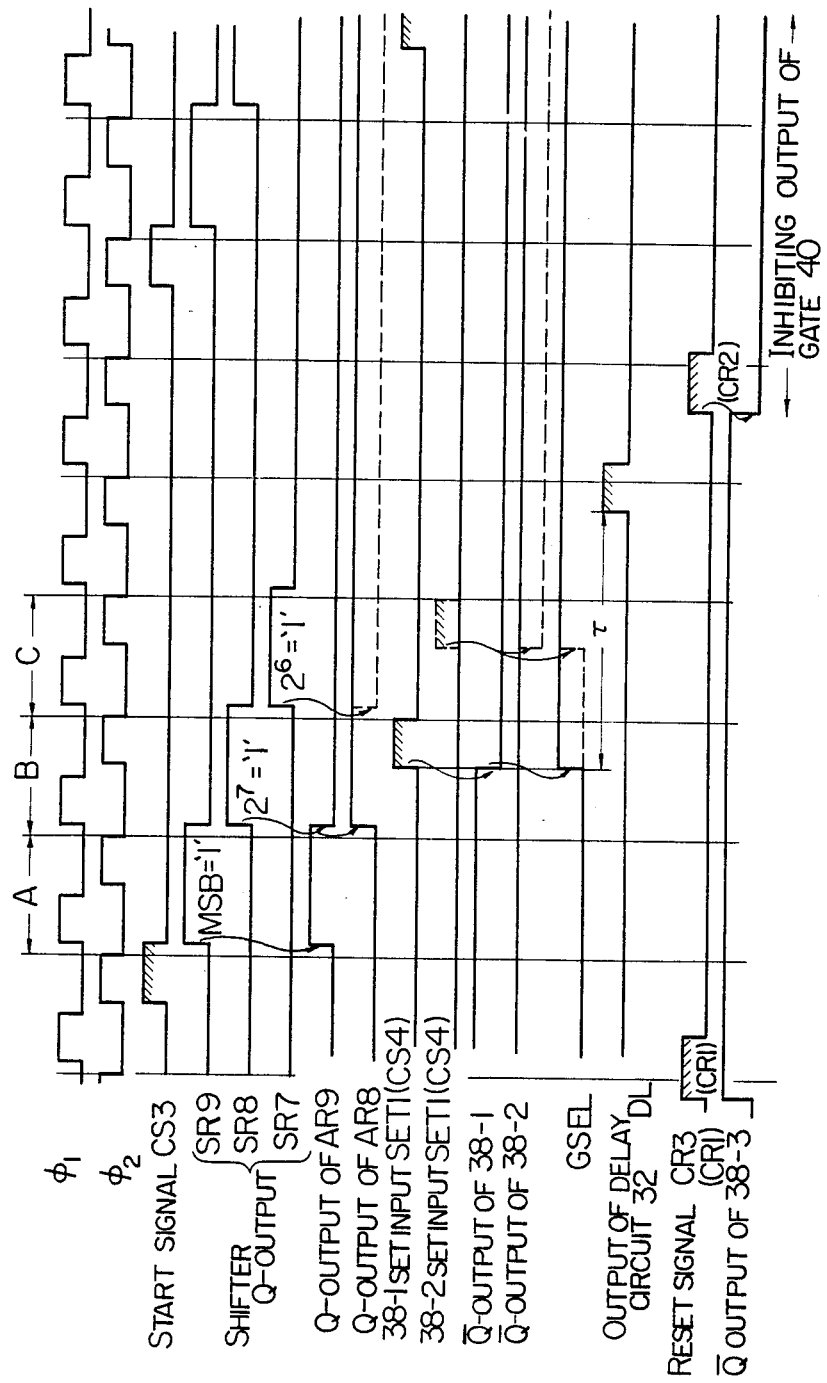
FIG. 8 is a time chart for explaining the operation of the A/D converter of FIG. 4.

Next, the operation of the device shown in FIG. 4 will be described with reference to the time chart of FIG. 8. Upon receipt of the conversion start signal CS, the synchronizing circuit 33-1 produces the reset signal CR1 and start signal CS1 in synchronism with the two-phase clocks $\phi_1$ and $\phi_2$ as mentioned above, which signals are respectively applied through the NOR gates 33-2 and 33-1 thereby to produce the reset signal CR3 and the start signal CS3. The reset signal CR3 resets each flip-flop of the shift register 34 and the successive approximation register 35. The start signal CS3 is applied as a carry signal to the shift register 34. In the first period A of the clock pulse $\phi_1$ after application of the start signal CS3, MSB of the shift register 34 is set at "1", that is, the flip-flop SR9 is set thereby to produce a "1" signal at output Q. Since the remaining bits of the shift register are "0", the digits AR9, AR8, . . . , AR1 of the successive approximation register 35 are set at 1, 0, 0, 0, . . . 0, respectively. As a result, in the same manner as explained with reference to FIG. 2, the reference analog signal 9 corresponding to "1000 . . . 0" is produced from the D/A converter including the ladder resistor 21 and tree switch 22 and applied to the comparator 3. THe analog output signal of the multiplexer 1, on the other hand, is applied as a signal 7 to the comparator 3 through the variable gain amplifier 2 whose gain is set at "1". The comparator 3 compares the signal 7 with signal 9, so that the output signal 8 is "1" when signal $7 \leqq$ signal 9, and is "0" when signal 7 > signal 9.

In the second period B of the clock pulse $\phi_1$, the condition of each flip-flop of the shift register 34 is shifted to the next one in the rightward direction, and hence the flip-flop SR8 is set so that the SR8 bit, i.e. its Q-output, goes to "1", while a "0" signal is produced at the Q-outputs of the other flip-flops. Since the Q-output "1" of SR8 is applied to the AND gate 36-9, the signal 8 is applied to the reset terminal of the flip-flop AR9 of the successive approximation register 35. As a result, when signal 8 is "1", i.e. signal $7 \leqq$ signal 9, the Q-output of AR9 is set at "0", while when signal 8 is "0", i.e. signal 7 > signal 9, the Q-output of AR9 remains unchanged at "1". The Q-output "1" of SR8 sets the flip-flop AR8 of the successive approximation register 35 thereby to set the AR8 bit at "1" at the same time. Depending on whether the AR9 bit is "1" or "0", the data stored in the successive approximation register 35 represents "1100 . . . 0" or "0100 . . . 0" respectively. The reference analog signal 9 corresponding to the contents of the register 35 is produced from the D/A converter and the value of the AR8 bit is established in the same way as mentioned above. In the normal A/D conversion mode, this process is repeated, so that the values of the bits AR7, AR6 . . . AR1 are sequentially established and thus the contents of the successive approximation register 35 represents the value of the digital signal obtained by A/D conversion of the analog input signal. The resulting digital value is applied through the bus 10 to be processed in the external microprocessor.

Next, the case in which the A/D converter is used in a gain select mode will be explained. For this purpose, a register 44 is provided for setting the desired gain select mode. The contents of the register 44 are selectively written depending on the desired gain select mode through a bus 10 from the external microprocessor. In the illustrated embodiment a register having two bits $G_1$ and $G_0$ is used. Two bits $G_1$ and $G_0$ are defined as shown in Table 1 in accordance with the predetermined four operating modes, so that a corresponding operating mode is selected in accordance with the values $G_1$ and $G_0$ written from the microprocessor. That is $G_1G_0=$"00": Normal mode in which the gain of the amplifier is always set constant so that all the analog input signals are converted into digital signals at the same rate.

$G_1G_0=$"01": Double gain select mode in which, if the level of the analog input signal is not higher than a predetermined reference level ($\frac{1}{2}$ of full scale), the gain of the amplifier is changed to two times of the normal gain so that such analog signals are subject to A/D conversion after being amplified by two times.

$G_1G_0=$"10": Quadruple gain select mode in which of the level of the analog input signal is not higher than a predetermined reference level ($\frac{1}{4}$ of full scale), the gain of the amplifier is changed to four times of the normal gain so that such analog signals are subjected to A/D conversion after being amplified by four times.

$G_1G_0=$"11": Programmable S/H mode in which an amplifier circuit having sampling and holding functions is connected to the A/D converter and the timing of sampling and holding of the analog input signal is controlled by the contents of the gain select mode setting register 44.

TABLE I

| Operating mode | Mode-setting register $G_1$ | Mode-setting register $G_0$ | Determinative condition | Gain select signal (GSEL) | Weighting register $W_1$ | Weighting register $W_0$ |
|---|---|---|---|---|---|---|
| Normal mode | 0 | 0 | — | 0 | 0 | 0 |
| Double gain select mode | 0 | 1 | SR9 = 0 | 1 | 0 | 1 |
| | | | SR9 = 1 | 0 | 0 | 0 |
| Quadruple gain select mode | 1 | 0 | SR9 = 0 SR8 = 0 | 1 | 1 | 0 |
| | | | SR9 = 0 or 1 SR9 = 1 | 0 | 0 | 0 |
| Programmable S/H | 1 | 1 | — | 1 | 0 | 0 |

When the system is operated at the double or quadruple gain select mode, "01" or "10" is written into the weighting register 37 with the amplifier gain select signal GSEL="1", respectively, in order to indicate the weight of the data in the successive approximation register 35, i.e., the digital value obtained by A/D conversion after being amplified by two or four times in the case where the level of the input analog signal is lower than the reference level. The data in the weighting register 37, together with the data in the register 35, are read into the microprocessor and used for deciding the weight of the digital value.

Next, the operation of the circuits in the case where $G_1G_0=$"01" will be explained with reference to FIG. 8. As explained above, the AR9 bit in the successive approximation register 35 is establishd at the timing when the Q-output "1" of SR8 is applied to the AND gate 36-9 in the period B of the clock pulse $\phi_1$. The NOR gate 39-1 is impressed with the $\overline{Q}$-output or inversion of Q-output of SR8, an inversion of the clock pulse $\phi_2$ and the Q-output of AR9. Therefore, when the Q-output of AR9="0", a set pulse SET1 is generated for setting the flip-flop 38-1 at the time of the clock pulse $\phi_2$ generated in the period B. It should be noted that the SET1 pulse is not generated when the Q-output of AR9="1". In other words, when the input analog signal is smaller than the reference signal 9 corresponding to the data "100000000" in the successve approximation register, the set pulse SET1 is generated, so that the flip-flop 38-1 is set, thus producing a "0" signal at $\overline{Q}$ output. The output signals A3, A2, A1 and A0 of the address decoder 43 take logic values as shown in Table II in accordance with the values of $G_1$ and $G_0$ bits of the register 44.

TABLE II

| $G_1$ | $G_0$ | $A_3$ | $A_2$ | $A_1$ | $A_0$ |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

When $G_1G_0$="01", A3=0, A2=0, A1=1 and A0=0. Therefore, the output of the NOR gate 41-1 goes "1" in accordance with the signal of SET1="1". Also, a "1" signal is produced at the outputs of the NOR gates 41-3 and 41-4, so that the amplifier gain select signal GSEL=1 is generated. At the same time, the SET1=1 signal is applied through the 2-AND OR gate 40 to the delay circuit 32. Under this condition, the SR flip-flop 38-3 is reset by the CR1 pulse, and its $\overline{Q}$-output is "1", so that the gate 40 allows the SET1 signal to be applied to the delay circuit 32, which in turn produces an output D/A at a delay $\tau$ after application of the input SET1 signal. The output DL is applied to the synchronizing circuit 31-2, which in turn generates a start signal CS2 and a reset signal CR-2 synchronous with the clock pulse $\phi_2$. The NOR gates 33-1 and 33-2 are impressed with CS1, CS2 and CR1, CR2 respectively thereby to produce a start signal CS3 and a reset signal CR3, thus resuming the A/D conversion cycle as in the same manner as that in the application of the conversion start signal CS. Since the flip-flop 38-3 is set by CR2, however, the $\overline{Q}$-output thereof is "0" and therefore the 2-AND NOR gate 40 is prevented from generating the signal CR4, so that the A/D conversion is continued until the AR1 bit of the successive approximation register is established. The time delay $\tau$ by the delay circuit 32 is provided for compensating the slew rate or settling time of the amplifier 2 and the time required for changing the gain of the amplifier 2 after generation of the signal GSEL.

The foregoing description concerns the case in which the A/D converter is set at the double gain select mode. In the case where it is set at the quadruple gain select mode, the mode-setting register 44 is set at $G_1G_0$="10". Therefore, the outputs of the address code register goes A3=0, A2=1, A1=0 and A0=0, thus disenabling the gates 41-1 and 40-1. Thus the output signal SET1 of the NOR gate 39-1 which is generated in response to the Q-output of AR9=1 has no effect on the circuit operation. On the other hand, the NOR gate 41-2 and AND gate 40-2 become effective, so that the gain of the amplifier is switched by the output signal SET2 of the NOR gate 39-2. The timing for the quadruple gain mode is shown by the dotted line in FIG. 8. The input signals of the NOR gate 39-2 include the $\overline{Q}$-output of SR7 of the shift register (corresponding to the inversion of Q-output of SR7), the inversion of the clock pulse $\phi_2$, Q-outputs of AR9 and AR8, and therefore, when the Q-outputs of AR9 and AR8 are both "0", the pulse SET2 is generated at the timing of the Q-output of SR7="1" in the period C of the clock pulse $\phi_2$, so that the flip-flop 38-2 is set, thus producing the GSEL=1 signal from the NOR gate 41-4. Thus the A/D conversion cycle is restarted in the same manner (but with the gain of the amplifier changed to four times) as in the case of SET1="1" with the double gain select mode, and this conversion cycle is continued until the AR9, AR8, . . . , AR1 bits of the successive approximation register 35 are established.

As an additional point, it should be noted that, the SR flip-flops 38-1 and 38-2 are reset by the signal CR1 or the conversion end signal CE, i.e. the Q-output "1" of SR0 of the shift register 34. Also, the GSEL signal 1 is kept at "1" until the A/D conversion cycle involved is completed after generation thereof in the period B or C or the clock pulse $\phi_1$. The amplifier 2 may be interchanged by another amplifier of a different type depending on the applied gain select mode. For example, if the A/D converter is used in the double gain select mode, an amplifier whose gain is changeable from "1" to "2" or vise versa is used, while if the A/D converter is used in the quadruple gain select mode, an amplifier whose gain is changeable from "1" to "4" or vise versa is used. Alternatively, it is possible to use an amplifier whose gain is selectively set at any one of "1", "2" and "4" and to set the gain of the amplifier at one of them depending on the mode-setting signal and the GSEL signal.

Figure 10:
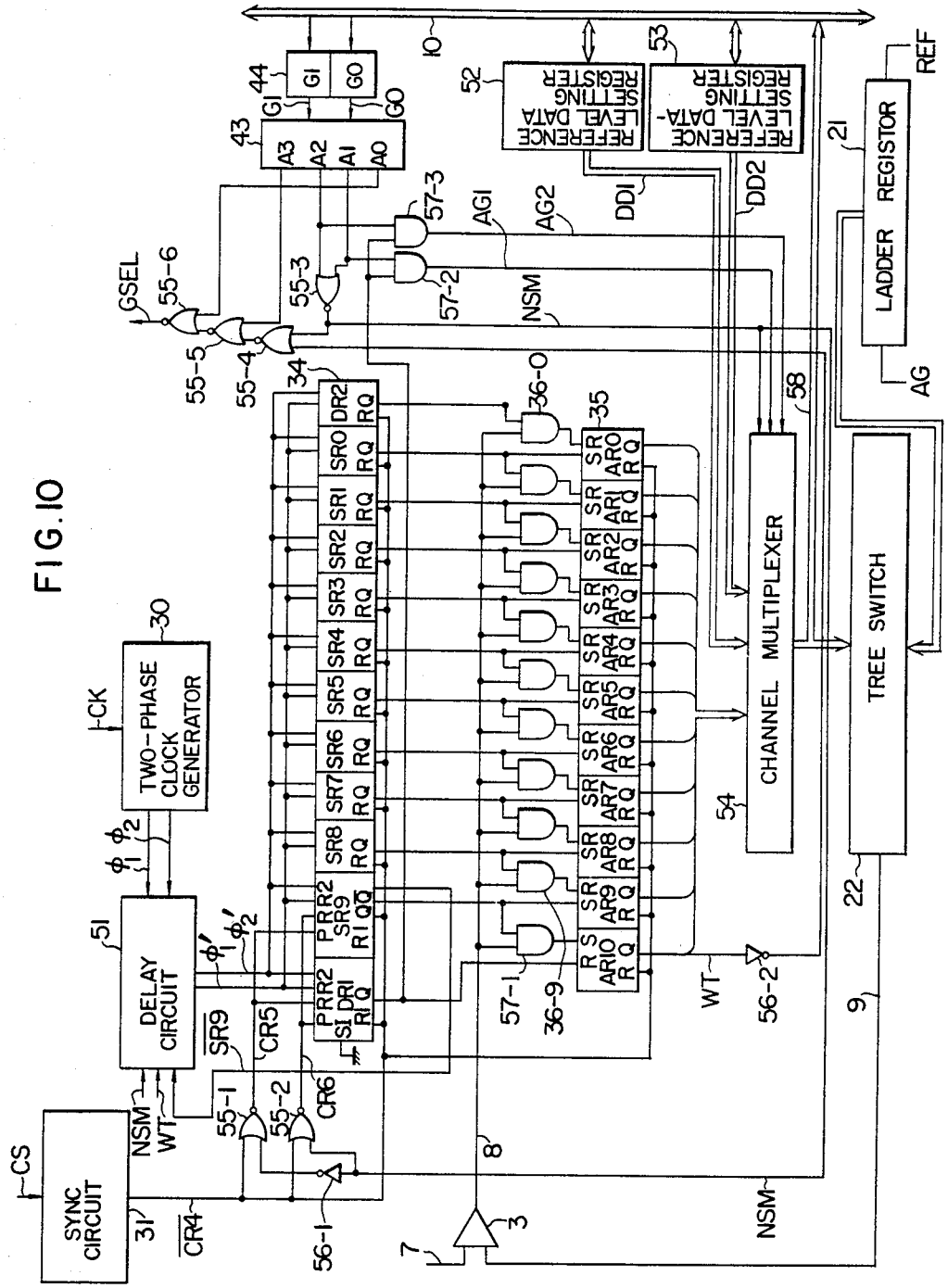
FIG. 10 is a diagram showing a circuit of another embodiment of the A/D converter according to the present invention.
Figure 14:
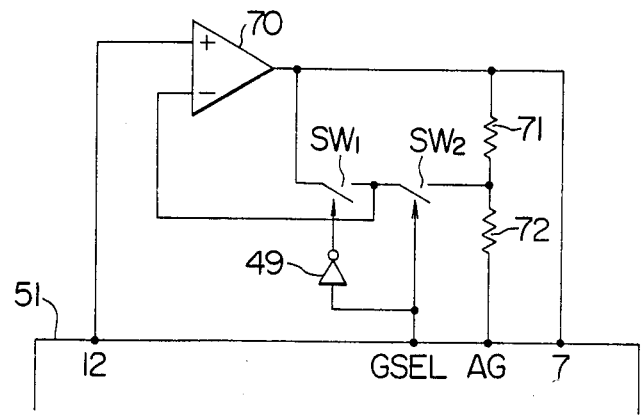
FIG. 14 shows a circuit arrangement of a programmable gain amplifier connected to an A/D converter of the present invention.

FIG. 14 shows a circuit arrangement of such an amplifier circuit connected to the A/D converter of FIG. 4 or 10 and comprising an operation amplifier 70, resistors 71 and 72, analog switches SW1 and SW2 which may be composed of MOS transistors and an inverter 49. For example, the amplifier circuit of FIG. 14 is used as a gain programmable amplifier whose gain is changeable from "1" to "4" or vice versa, by using 3 kΩ (0.1% of tolerance) of resistance for the resistor 71 and 1 kΩ (0.1% of tolerance) of resistance for the resistor 72. If the level of the analog input signal is larger than ¼ of the full scale, the GSEL signal is "0" thereby causing the switches SW1 and SW2 to close and open, respectively so that the amplifier operates at a gain of "1". On the other hand, if the level of the analog input signal is not larger than ¼ of the full scale, the GSEL signal is "1", thereby causing the switches SW1 and SW2 to open and close, respectively so that the amplifier operates at a gain of "4".

The condition of the weighting bit-storing register 37 is determined as shown in Table I by the bits $G_1$ and $G_0$ of the mode-setting register 44. Such a condition is set at the timing of the signal CS4 and held until it is reset by the start pulse CR1 for next A/D conversion cycle. The successive approximation register 35 and the shift register 34 are reset by the reset signal CR3, and initialized to the original condition thereof prior to the starting of A/D conversion cycle by the next start signal.

Figure 9:
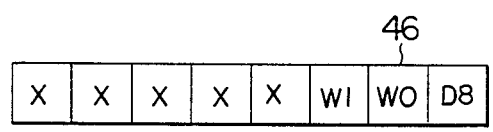
FIG. 9 is a diagram showing the bit assignment for the digital data obtained by A/D conversion and the weight flag thereof in a successive approximation register.
Figure 9:
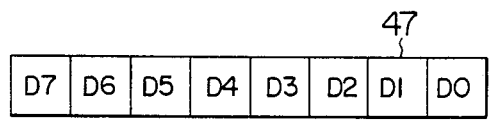

In this embodiment, as described above, the gain of the amplifier is not changed for the analog input signal having a level higher than the reference analog signal determined by the set gain select mode, and the A/D conversion cycle is continued until the LSB (least significant bit) of the successive approximation register is established. The change of the gain of the amplifier is carried out only for the analog input signal having a level not higher than the reference analog signal, and then the A/D conversion cycle is repeated. Therefore, the efficiency of the A/D conversion process is improved thereby reducing the occupation rate of the microprocessor for the A/D conversion process. If the 9-bit A/D converted data of the successive approximation register and the weighting bits of the weighting register are stored separately in the high byte data register 46 and the low byte data register 47 as shown in FIG. 9 which are read out in two steps through an 8-bit data bus 10, the weighting bits W1 and W0 are read out together with the most significant bit D8 by reading the data register 46, thus leading to the advantage that the weight thereof can be determined with only one byte access.

Next, an embodiment of the invention applied to the 10-bit A/D converter will be explained with reference to FIG. 10, which shows only those components corresponding to the comparator 3, the A/D control circuit 4, and D/A converter 5 and the mode control circuit 6 in FIG. 1 but does not show the other components for convenience' sake. Also, like component elements as in FIG. 4 are denoted by the same reference numerals in FIG. 10. The A/D control circuit corresponding to the block 4 of FIG. 1 comprises a two-phase clock generator circuit 30, a synchronizing circuit 31, a delay circuit 51, a shift register 34, a 10-bit successive approximation register 35, AND gates 36-0, 36-1 . . . , 36-9, 57-1, NOR gates 55-1 and 55-2, and an inverter 56-1. The mode control circuit corresponding to the block 6 in FIG. 1 comprises a gain select mode setting register 44, an address decoder 43, reference level data setting registers 52, 53, NOR gates 55-3, 55-4, 55-5, 55-6 and AND gates 57-2, 57-3.

Figure 11A:
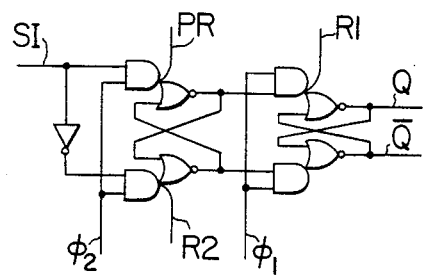
FIGS. 11a and 11b are diagrams showing circuit elements making up the shift register of the A/D converter in FIG. 10.
Figure 11B:
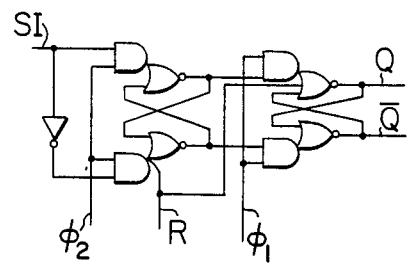

The synchronizing circuit 31 is similar to the synchronizing circuit 31-1 or 31-2, and is arranged to receive the conversion start signal CS, and produce a signal $\overline{CR4}$ which is an inversion of the reset signal CR4. The signal NSM is a decode signal for the operating mode which is a NOR output of A1 and A2 and takes a logical value "1" when A1=0 and A2=0, i.e. in the normal mode of $G_1G_0$="00" or sample/hold mode of $G_1G_0$="11", and a logical value "0" in the other modes. The NOR gates 55-1, 55-2 and the inverter 56-1 constitute a multiplexer, which produces a signal CR6 through NOR gate 55-2 in the gain select mode and a signal CR5 through the NOR gate 55-1 in the normal mode in response to the reset signal CR4. The shift register 34 has a capacity of 12 bits including DR1, SR9 to SR0 and DR2, of which each of SR8 to SR0 and DR2 is comprised of the circuit shown in FIG. 11b and each of DR1 and SR9 is comprised of the circuit shown in FIG. 11a. In each of DR1 and SR9, the master flip-flop of the slave flip-flop have independent reset terminals R2 and R1, respectively, and the master flip-flop has a preset terminal PR. The master flip-flop and the slave flip-flop are driven by the clock pulses $\phi_2$ and $\phi_1$ respectively. In the normal mode, the pulse CR5 is generated to reset the master flip-flop of DR1 and preset the master flip-flop of SR9, thus setting the initial condition for A/D conversion process in the normal mode. In the gain select mode, by contrast, the pulse CR6 is generated to preset the master flip-flop of DR1 and reset the master flip-flop of SR9, thus setting the initial condition for the gain select mode. In other words, SR9 of the shift register is initially set at "1" in the normal mode, while DR1 thereof is initially set at "1" in the gain select mode before start of the A/D conversion process.

Figure 13:
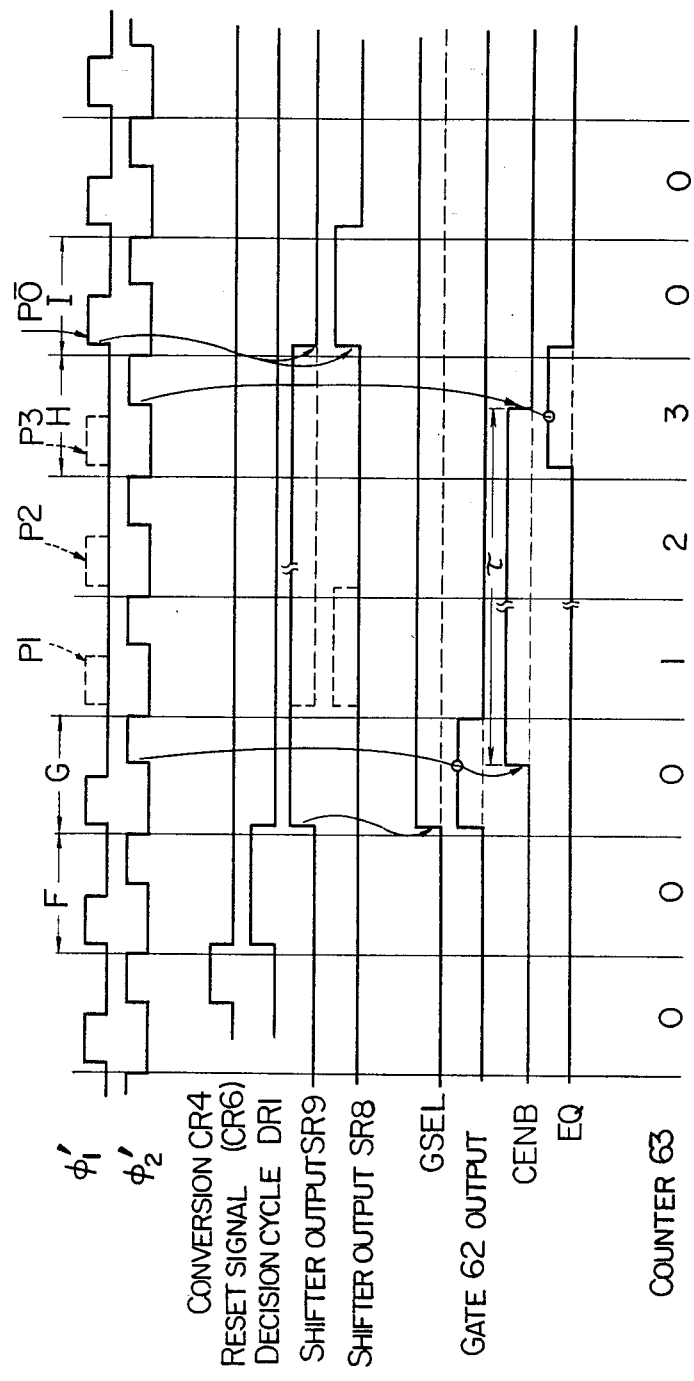
FIG. 13 is a time chart for explaining the operation of the A/D converter in FIG. 10.

The operation in the double gain select mode will be explained with reference to the time chart of FIG. 13. First, the reset signal CR4 in synchronism with the clock pulse $\phi_2$ resets the master and slave flip-flops of SR8 and SR0 and DR2 and the slave flip-flops of SR1 and DR1 in the shift register 34 and AR0 to AR9 in the successive approximation register 35. At the same time, in view of the fact that NSM is "0", CR6 is generated to preset the master flip-flop of DR1 and reset the master flip-flop of SR9. As a result, in the period F, the Q output of DR1 (hereinafter referred to as merely "output DR1") becomes "1" in synchronism with the clock pulse $\phi_1$. Since the output of the address decoder 43 are A0=0, A1=1, A2=0 and A3=0, the output DR1=1 is applied as a switch control signal AG1 to the channel multiplexer 54 through the AND gate 57-2. In response to the signal AG1=1, the multiplexer 54 reads out the reference data DD1 stored in advance in the data register 52. The reference data DD1 takes the form of a digital value corresponding to, say, 40% of the full scale of the analog input signal. The reference data DD1 is converted into the reference analog signal 9 by the D/A converter 22, and compared with the analog input signal 7 by the comparator 3. As a result of comparison, the AR10 bit is established in the period G of the clock pulse $\phi_1$ in the manner similar to the embodiment in FIG. 4, thus setting AR9 at "1". The AR10 bit is set at "0" when the input signal 7 is larger than the reference signal 9.

When the quadruple gain select mode is set, i.e., when $G_1G_0$="10", and hence A3=0, A2=1, A1=0, and A0=0, the output DR1="1" is applied through the AND gate 57-3 as a switch control signal AG2 to the channel multiplexer 54, thus reading out the reference data DD2 stored in advance in the data register 53. The reference data DD2 represents a digital data corresponding to, say, 20% of the full scale of the analog input signal. In the manner similar to the case mentioned above, the data DD2 is subjected to D/A conversion thereby to produce an analog signal 9 which is compared with the analog input signal. Thus, in the embodiment under consideration, the input address signal 7 is compared with reference analog signal 9 selected depending on the selected gain select mode always in the period F of the clock pulse $\phi_1$ in either the double gain select mode or the quadruple gain select mode. AR10 is set at "0" when the input signal is higher than the reference analog signal 9, and set at "1" when the input signal 7 is not higher than the reference analog signal 9. In this way, the period F is used as a cycle for determining the level of the input signal and the value of AR10 is established depending on the result of the determination and held until the start of A/D conversion of the next input signal. In FIG. 13, the dotted lines show a time chart in the case where the signal 7 is larger than the reference signal 9. The output of AR10 may be used as a weighting signal WT showing the weight of the data subjected to A/D conversion. When AR10="1", and hence WT="1", the signal GSEL is set at "1" through the NOR gates 55-4, 55-5 and 55-6, thus changing the gain of the amplifier to a value corresponding to the selected gain select mode.

Figure 12:
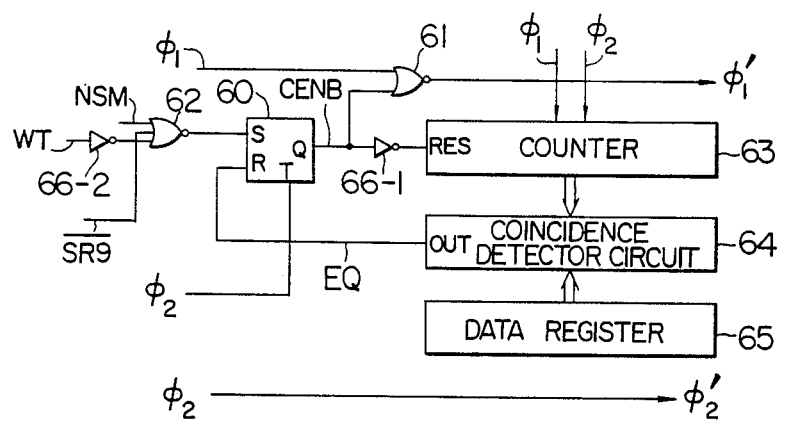
FIG. 12 is a diagram showing a configuration of the delay circuit of the A/D converter in FIG. 10.

The weighting signal WT=1 is applied to the delay circuit 51, which includes, as shown in FIG. 12, the SR flip-flop 60, the NOR gates 61, 62, the counter 63, the coincidence detector circuit 64, the data register 65 and the inverter 66-2. As shown in FIG. 13, the NOR gate 62 produces a "1" signal when NSM="0", WT="1" and $\overline{SR9}$="0" (hence, SR9=1), thus setting the SR flip-flop 60. As a result, the SR flip-flop 60 generates a count enable signal CENB=1 which rises in synchronism with the clock pulse $\phi_2$ of the period G. The inversion of the signal CENB=1 is applied to the reset terminal RES of the counter 63, thus starting the counting operation of the counter 63. The coincidence detector circuit 64 detects the coincidence of the count of the counter 63 with the binary data stored in the data register 65 and generates a coincidence signal EQ. The coincidence signal EQ resets the flip-flop 60, and CNEB becomes "0", thus stopping the counting operation of the counter 63. Both the rise and fall of the signal CNEB is synchronized with the clock pulse $\phi_2$, when CENB is "1", the NOR gate 61 prohibits the passage of the clock pulse $\phi_1$. FIG. 13 shows the case in which the binary number of the data register 65 is "11"=3 so that the passage of the pulses P1, P2 and P3 of the clock signal $\phi_1$ is prohibited. Thus, the generation of the Q-output of SR9 of the shift register 34 is delayed to the time point $\overline{PO}$. This delay time compensates for the settling time and the slew rate of the gain switching time of the programmable gain amplifier 2. After the time point $\overline{PO}$, the bits of the successive approximation register 35 are sequentially established in the same manner as the normal mode under the timing control by the clock pulse $\phi_1$, so that the establishment of the AR0 bit completes the A/D conversion of one analog signal.

The data register 65 stores binary data corresponding to the delay time $\tau$ and the output of SR9 extends by a time corresponding to the product of the delay time $\tau$ and the period of the clock pulse $\phi_1$. In the foregoing description, it is assumed that the data corresponding to 40% and 20% of the full scale are stored in the data registers 52 and 53. These percentages lower than $\frac{1}{2}$ (50%) and $\frac{1}{4}$ (25%) of the full scale are adopted taking into consideration the accuracy of the circuit. However, it will be understood that any other suitable percentages may be used depending on the circuit characteristics.

As described above, according to the embodiment of FIG. 10, the cycle of establishing the AR10 bit of the successive approximation register 35 is used to determine the level range of the analog input signal, so that AR10 is set at "1" or "0" in accordance with the level range thus determined. In other words, AR10 is set at "1" and the gain of the amplifier is changed accordingly when the input analog signal level is not higher than the reference analog signal corresponding to the selected gain select mode. And after the delay time corresponding to the time required for the gain change, the A/D conversion of the input signal begins, thus establishing the bits AR9, AR8, . . . AR0. When AR10=0, the switching of the amplifier gain is not required, so that the bits AR9, AR8, . . . AR0 are established, that is, the A/D conversion is effected in synchronism with the clock pulse $\phi_1$ without any delay time.

Figure 15:
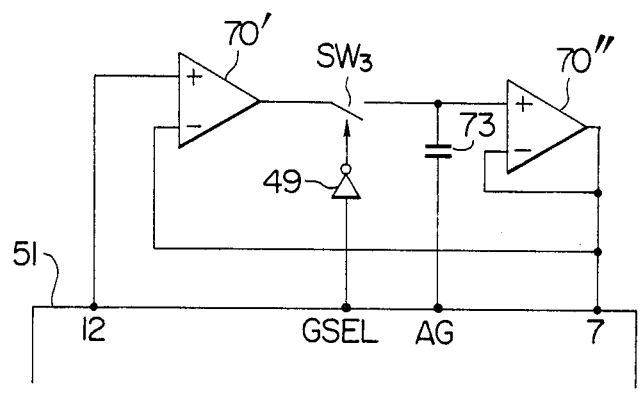
FIG. 15 shows a circuit arrangement of an amplifier having sample and hold functions and connected to an A/D converter of the present invention.

FIG. 15 shows an amplifier circuit having sample and hold functions and connected to the A/D converter of FIG. 4 or 10 to be used in the programmable S/H mode. In FIG. 15, 70' and 70" are operation amplifiers, SW3 analog switch, 73 a capacitor and 49 an inverter. When the gain select mode setting registor 44 is set at "00", the GSEL signal goes "0" which in turn causes the switch SW3 to close so that the capacitor 73 is charged to a voltage corresponding to the analog input signal. Then, the switch SW3 is opened in response to the GSEL signal being "1" by changing the gain select mode to the programmable S/H mode, so that the analog input signal represented by the voltage across the capacitor 73 is subjected to A/D conversion.

We claim:

1. An apparatus for converting an analog signal into a digital signal in a selected gain mode and adapted to be arranged in the form of a single chip LSI, said apparatus comprising:

first terminal means for receiving an analog signal;

second terminal means for connecting an external variable gain amplifier so as to amplify said received analog signal, the gain of said amplifier being variable according to a gain select signal applied thereto;

a register for storing data for determining the gain mode of said variable gain amplifier, said data being settable according to a command externally applied thereof;

a successive approximation A/D converter disposed to receive an analog signal amplified by said amplifier, said converter being operative to convert said amplified signal into a digital signal whose digits are determined successively from a digit of highest order to a digit of lowest order by successive comparison of said amplified analog signal with different levels of reference signals;

a mode control gate means coupled to an output of said successive approximation A/D converter and responsive to a determination by said A/D converter of the values of a predetermined number of higher order digits of the digital signal obtained during the operation of A/D conversion of the amplified analog signal by said A/D converter, said predetermined number being determined according to the mode set by said data stored in said register for producing a first signal indicative of whether the gain of said amplifier is to be changed or not depending on said determined values of the higher order digits;

third terminal means for coupling said first signal externally of said apparatus so that said first signal is supplied, as said gain select signal, to said amplifier connected to said first terminal means; and said mode control gate means further producing a second signal which causes said A/D converter to continue its operation of A/D conversion of said amplified analog signal when the gain of said amplifier is not to be changed and to stop its operation of A/D conversion of said amplified analog signal when the gain of said amplifier is to be changed and again start its operation to effect the A/D conversion on the newly amplified analog signal after the gain of said amplifier has been changed according to said first signal.

2. An apparatus according to claim 1, wherein said successive approximation A/D converter comprises:

a successive approximation register having digit positions for storing the values of digits representing the digital signal obtained by A/D conversion of said analog signal;

means for placing a predetermined value into said digit positions of said successive approximation register, successively, from the digit for the highest order to that for the lowest order;

means for successively producing reference analog signals corresponding to the respective contents of said successive approximation register after said predetermined value has been placed into the respective digit positions of said successive approximation A/D converter; and means for successively comparing the applied analog signal with the respective reference analog signals thereby successively determining the values to be stored in said digit positions depending on the result of said comparison.

3. An apparatus according to claim 1, further comprising a weighting bit register coupled to the output of said A/D converter for providing weighting bits for the A/D converter output in accordance with the selected gain mode.

4. An apparatus according to claim 3, wherein said weighting bit register is normally reset and set to a predetermined code representing the selected gain mode when the gain of said amplifier is changed.

5. An apparatus according to claim 1, wherein the selected gain modes include a normal gain mode for operating said amplifier at a gain of "1" and a double gain mode for operating said amplifier at a gain of "2".

6. An apparatus according to claim 1, wherein the selected gain modes include a normal gain mode for operating said amplifier at a gain of "1" and a quadruple gain mode for operating said amplifier at a gain of "4".

7. An apparatus according to claim 1, further comprising means for initially setting said gain mode at said normal gain value.

* * * * *